(12) United States Patent
Fery et al.

(10) Patent No.: US 7,897,437 B2
(45) Date of Patent: Mar. 1, 2011

(54) THERMAL INTERCONNECT SYSTEMS METHODS OF PRODUCTION AND USES THEREOF

(75) Inventors: Mark Fery, Spokane, WA (US); Jai Subramanian, Liberty Lake, WA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/961,067

(22) Filed: Dec. 20, 2007

(65) Prior Publication Data

US 2008/0176095 A1 Jul. 24, 2008

Related U.S. Application Data

(62) Division of application No. 10/545,597, filed on Apr. 4, 2006, now Pat. No. 7,378,730.

(51) Int. Cl.
*H01L 21/00* (2006.01)

(52) U.S. Cl. .................. 438/122; 205/80; 205/261; 205/266

(58) Field of Classification Search .......... 257/276, 257/625, 675, 706, 707, 712–722, 796, E33.075, 257/E31.131, E23.051, E23.08–E23.113; 205/104, 80, 84, 95, 102, 123, 247, 261, 205/266
See application file for complete search history.

(56) References Cited

U.S. PATENT DOCUMENTS

| | | | | |
|---|---|---|---|---|
| 2,969,295 | A * | 1/1961 | Crishal et al. | 427/343 |
| 3,946,334 | A * | 3/1976 | Yonezu et al. | 372/36 |
| 4,817,854 | A * | 4/1989 | Tihanyi et al. | 228/124.1 |
| 5,057,903 | A * | 10/1991 | Olla | 257/707 |
| 5,925,901 | A * | 7/1999 | Tsutsui | 257/276 |
| 6,150,713 | A | 11/2000 | Park et al. | |
| 6,492,739 | B2 * | 12/2002 | Muto et al. | 257/787 |
| 6,884,335 | B2 * | 4/2005 | Webb et al. | 205/104 |
| 7,268,427 | B2 * | 9/2007 | Anzai | 257/707 |
| 2003/0183368 | A1 * | 10/2003 | Paradis et al. | 165/80.3 |

FOREIGN PATENT DOCUMENTS

| | | | |
|---|---|---|---|
| CN | 1388580 | A | 1/2003 |
| GB | 2113590 | * | 12/1981 |
| JP | 62151592 | A | 6/1987 |
| JP | 07326702 | A | 12/1995 |
| JP | 2002261403 | A | 9/2002 |

* cited by examiner

*Primary Examiner*—Jasmine J Clark
(74) *Attorney, Agent, or Firm*—Faegre & Benson LLP

(57) ABSTRACT

Layered interface materials described herein include at least one pulse-plated thermally conductive material, such as an interconnect material, and at least one heat spreader component coupled to the at least one pulse-plated thermally conductive material. A plated layered interface material having a migration component is also described herein and includes at least one pulse-plated thermally conductive material; and at least one heat spreader component, wherein the migration component of the plated layered interface material is reduced by at least 51% as compared to the migration component of a reference layered interface material. Another layered interface material described herein includes: a) a thermal conductor; b) a protective layer; c) a layer of material to accept solder and prevent the formation of oxides; and d) a layer of solder material. Methods of forming layered interface materials are described herein that include: a) providing a pulse-plated thermally conductive interface material; b) providing a heat spreader component; and c) physically coupling the thermally conductive interface material and the heat spreader component. At least one additional layer, including a substrate layer, a surface, an adhesive, a compliant fibrous component or any other suitable layer or a thermal interface material, can be coupled to the layered interface material.

15 Claims, No Drawings

THERMAL INTERCONNECT SYSTEMS METHODS OF PRODUCTION AND USES THEREOF

This application claims priority to U.S. Provisional Application Ser. No. 60/448,722 filed on Feb. 19, 2003, which is commonly-owned and incorporated herein in its entirety by reference.

This application is a divisional of application Ser. No. 10/545,597, filed April 4, 2006, now U.S. Pat. No. 7,378,730 and which is incorporated herein by reference in its entirety.

FIELD OF THE INVENTION

The field of the invention is thermal interconnect systems in electronic components, semiconductor components and other related layered materials applications.

BACKGROUND

Electronic components are used in ever increasing numbers of consumer and commercial electronic products. Examples of some of these consumer and commercial products are televisions, personal computers, Internet servers, cell phones, pagers, palm-type organizers, portable radios, ca stereos, or remote controls. As the demand for these consumer and commercial electronics increases, there is also a demand for those same products to become smaller, more functional and more portable for consumers and businesses.

As a result of the size decrease in these products, the components that comprise the products must also become smaller and better manufactured and designed. Examples of some of those components that need to be reduced in size or scaled down are printed circuit or wiring boards, resistors, wiring, keyboards, touch pads, and chip packaging. Many products and components also need to be prepackaged, such that the product and/or component can more readily be adapted to perform several related or unrelated functions and tasks. Examples of some of these "total solution" components and products comprise layered materials, mother boards, cellular and wireless phones and telecommunications devices and other components and products, such as those found in U.S. Patent and PCT Application Ser. Nos. 60/396,294 filed Jul. 15, 2002, 60/294,433 filed May 30, 200100 and PCT/US02/17331 filed May 30, 2002, which are all commonly owned and incorporated herein in their entirety.

Components, therefore, are being broken down and investigated to determine if there are better building materials and methods that will allow them to be scaled down and/or combined to accommodate the demands for smaller electronic components. In layered components, two goals appear to be a) decreasing the number of the layers and/or b) decreasing the thickness of the layers while at the same time increasing the functionality and durability of the remaining layers in both cases. This task can be difficult, however, given that the number of layers cannot readily be reduced or made thinner without sacrificing functionality.

Also, as electronic devices become smaller and operate at higher speeds, energy emitted in the form of heat increases dramatically. A popular practice in the industry is to use thermal grease, or grease-like materials, alone or on a carrier in such devices to transfer the excess heat dissipated across physical interfaces. The most common types of thermal interface materials are thermal greases, phase change materials, and elastomer tapes. Thermal greases or phase change materials have lower thermal resistance than elastomer tape because of the ability to be spread in very thin layers and provide intimate contact between adjacent surfaces. Typical thermal impedance values range between 0.2-1.6° C. cm$^2$/W. However, a serious drawback of thermal grease is that thermal performance deteriorates significantly after thermal cycling, such as from 65° C. to 150° C., or after power cycling when used in VLSI chips. It has also been found that the performance of these materials deteriorates when large deviations from surface planarity causes gaps to form between the mating surfaces in the electronic devices, or when large gaps between mating surfaces are present for other reasons, such as manufacturing tolerances, etc. When the heat transferability of these materials breaks down, the performance of the electronic device in which they are used is adversely affected.

Thus, there is a continuing need to: a) design and produce thermal interconnects and thermal interface materials, layered materials, components and products that meet customer specifications while minimizing the size of the device and number of layers; b) produce more efficient and better designed materials, products and/or components with respect to the compatibility requirements of the material, component or finished product; c) develop reliable methods of producing desired thermal interconnect materials, thermal interface materials and layered materials and components/products comprising contemplated thermal interface and layered materials; and d) effectively reduce the number of production steps necessary for a package assembly, which in turn results in a lower cost of ownership over other conventional layered materials and processes.

SUMMARY OF THE INVENTION

Layered interface materials described herein include at least one pulse-plated thermally conductive material, such as an interconnect material, and at least one heat spreader component coupled to the at least one pulse-plated thermally conductive material.

A plated layered interface material having a migration component is also described herein and includes at least one pulse-plated thermally conductive material; and at least one heat spreader component, wherein the migration component of the plated layered interface material is reduced by at least 51% as compared to the migration component of a reference layered interface material.

Another layered interface material described herein includes: a) a thermal conductor; b) a protective layer; c) a layer of material to accept solder and prevent the formation of oxides; and d) a layer of solder material.

Methods of forming layered interface materials are described herein that include: a) providing a pulse-plated thermally conductive interface material; b) providing a heat spreader component; and c) physically coupling the thermally conductive interface material and the heat spreader component. At least one additional layer, including a substrate layer, a surface, an adhesive, a compliant fibrous component or any other suitable layer or a thermal interface material, can be coupled to the layered interface material.

DETAILED DESCRIPTION

A suitable interface material or component should conform to the mating surfaces ("wets" the surface), possess a low bulk thermal resistance and possess a low contact resistance. Bulk thermal resistance can be expressed as a function of the material's or component's thickness, thermal conductivity and area, Contact resistance is a measure of how well a material or component is able to make contact with a mating surface, layer or substrate. The thermal resistance of an interface material or component can be shown as follows:

$$\Theta_{interface} = t/kA + 2\Theta_{contact} \quad \text{Equation 1}$$

where
- $\Theta$ is the thermal resistance,
- t is the material thickness,
- k is the thermal conductivity of the material
- A is the area of the interface The term "t/kA" represents the thermal resistance of the bulk material and "$2\Theta_{contact}$" represents the thermal contact resistance at the two surfaces. A suitable interface material or component should have a low bulk resistance and a low contact resistance, i.e. at the mating surface.

Many electronic and semiconductor applications require that the interface material or component accommodate deviations from surface flatness resulting from manufacturing and/or warpage of components because of coefficient of thermal expansion (CTE) mismatches.

A material with a low value for k, such as thermal grease, performs well if the interface is thin, i.e. the "t" value is low. If the interface thickness increases by as little as 0.002 inches, the thermal performance can drop dramatically. Also, for such applications, differences in CTE between the mating components causes the gap to expand and contract with each temperature or power cycle. This variation of the interface thickness can cause pumping of fluid interface materials (such as grease) away from the interface.

Interfaces with a larger area are more prone to deviations from surface planarity as manufactured. To optimize thermal performance, the interface material should be able to conform to non-planar surfaces and thereby lower contact resistance. As used herein, the term "interface" means a couple or bond that forms the common boundary between two parts of matter or space, such as between two molecules, two backbones, a backbone and a network, two networks, etc. An interface may comprise a physical attachment of two parts of matter or components or a physical attraction between two parts of matter or components, including bond forces such as covalent and ionic bonding, and non-bond forces such as Van der Waals, electrostatic, coulombic, hydrogen bonding and/or magnetic attraction. Contemplated interfaces include those interfaces that are formed with bond forces, such as covalent bonds; however, it should be understood that any suitable adhesive attraction or attachment between the two parts of matter or components is preferred.

Optimal interface materials and interconnect materials and/or components possess a high thermal conductivity and a high mechanical compliance, e.g. will yield elastically when force is applied. High thermal conductivity reduces the first term of Equation 1 while high mechanical compliance reduces the second term. The layered interface materials and the individual components of the layered interface materials described herein accomplish these goals. When properly produced, the heat spreader component described herein will span the distance between the mating surfaces of the thermal interface material and the heat spreader component, thereby allowing a continuous high conductivity path from one surface to the other surface.

Thermal interface materials and thermal interconnect materials and layers, as described herein, may comprise PCM™ 45, which is a high conductivity phase change material manufactured by Honeywell International Inc., and/or metal and metal-based materials also manufactured by Honeywell International Inc. such as Ni, Cu, Al and AlSiC, which are classified as heat spreaders, i.e., materials that work to dissipate heat. Thermal interconnect materials and layers may also comprise metals, metal alloys and suitable composite materials that meet the following design goals; a) can be laid down in a thin or ultra thin layer or pattern; b) can conduct thermal energy better than conventional thermal adhesives; c) has a relatively high deposition rate; d) can be deposited on a surface or other layer without having pores develop in the deposited layer; e) can control migration of the underlying layer of material; and f) can be laid down as a coating in order to keep the surface free of oxides and ready to accept solder. These thermal interface materials, thermal interconnect materials, components and products comprising these materials may advantageously be pre-attached/pre-assembled thermal solutions and/or IC (interconnect) packages.

Layered interface materials described herein comprise at least one pulse-plated thermally conductive material, such as an interconnect material, and at least one heat spreader component coupled to the at least one pulse-plated thermally conductive material. The at least one pulse-plated thermally conductive material can be utilized as: a) a diffusion or migration barrier that protects the additional layer or component, such as a die, from to migration of components beneath the pulse-plated material and/or layer; b) a coating to keep the surface free of oxides and ready to accept solder, such as in the case of gold; and/or c) a coating of solder itself, as in the case of tin, indium, silver, lead and related alloys and combinations thereof.

A plated layered interface material having a migration component is also described herein and comprises at least one pulse-plated thermally conductive material; and at least one heat spreader component, wherein the migration component of the plated layered interface material is reduced by at least 51% as compared to the migration component of a reference layered interface material.

Another layered interface material described herein includes: a) a thermal conductor; b) a protective layer; c) a layer of material to accept solder and prevent the formation of oxides; and d) a layer of solder material.

A method of forming contemplated layered interface materials comprises: a) providing a pulse-plated thermally conductive interface material; b) providing a heat spreader component; and c) physically coupling the thermally conductive interface material and the heat spreader component. At least one additional layer, including a substrate layer, a surface, an adhesive, a compliant fibrous component or any other suitable layer or a thermal interface material, can be coupled to the layered interface material.

A conventional layered material for electronic and semiconductor applications comprising at least two layers may be used herein as a starting point for the production of the layered interface materials described herein. These conventional layered materials generally comprise a heat spreader component coupled to an additional electronic component through a thermal grease or conventional adhesive material. This conventional layered material is herein referred to as the "reference layered material" or "reference layered interface material". The layered materials described herein are similar to the reference layered materials, except that the thermal grease or conventional adhesive material is either replaced or separated from the heat spreader component and/or additional component by a pulse-plated thermally conductive non-porous material. These layered materials are herein referred to as the "plated layered materials" or "plated layered interface materials". As used herein, the term "reference" means a control, a standard and/or a generally accepted conventional product or material. For example, a reference material would be the "control" with which the plated material or plated layered material is compared. The reference is a sample of identical constitution and prepared under the same conditions for which all experimental, processing, manufacturing, chemical and/or physical variations are omitted. In chemical terms, the "reference" is analogous to a "blank", in that all of the properties of the variation or sample material are measured and calculated against the reference as if the properties of the reference equaled, in effect, zero. Therefore, when comparing relative properties of a reference material and a plated material, it is important that both the reference material and the plated material begin with the same base components before variations are incorporated into the plated material, plated layered material or the methods of production thereof.

In some contemplated embodiments, the pulse-plated thermally conductive material (migration blocking material) is responsible for a significant decrease in migratory atoms and/or molecules (herein referred to as a "migration component") when compared to the migration component of the reference layered material. A significant decrease in migratory atoms and/or molecules is understood to mean at least about a 51% decrease in migratory atoms and/or molecules when compared to the reference layered material. In other contemplated embodiments, the migration blocking materials are responsible for at least about a 60% decrease in migratory atoms and/or molecules when compared to the reference layered material. In yet other contemplated embodiments, the migration blocking materials are responsible for at least about a 75% decrease in migratory atoms and/or molecules when compared to the reference layered material. In preferred embodiments, the migration blocking materials are responsible for at least about a 90% decrease in migratory atoms and/or molecules when compared to the reference layered material. In even more preferred embodiments, the migration blocking materials are responsible for at least about a 95% decrease in migratory atoms and/or molecules when compared to the reference layered material.

It should also be appreciated that the migration blocking material or component can be designed to block the diffusion and/or migration of gases, liquids, metals and additional unwanted materials from diffusing into the underlying layer or material. The gases, liquids, metals and other/additional unwanted materials may be deposited by any process generally used in electronic materials development and processing, including CVD/ALD (atomic layer deposition) depositions, liquid cleans and etches of dielectric materials, gaseous thermal processing and gas etching.

As mentioned, thermal interconnect and/or interface materials, thermally conductive interconnect systems and layers may also comprise metals, metal alloys and suitable composite materials that meet at least one of the following design goals: a) can be laid down in a thin or ultra thin layer or pattern; b) can conduct thermal energy better than conventional thermal adhesives; c) has a relatively high deposition rate; d) can be deposited on a surface or other layer without having pores develop in the deposited layer; e) can control migration of the underlying layer of material; and f) can be laid down as a coating in order to keep the surface free of oxides and ready to accept solder.

Thermal interconnect and/or interface materials and layers that are suitable for use in the subject matter described herein should first be able to be laid down in a thin or ultra thin continuous layer or pattern. The pattern may be produced by the use of a mask or the pattern may be produced by a device capable of laying down a desired pattern. Contemplated patterns include any arrangement of points or dots, whether isolated or combined to form lines, filled-in spaces and so forth. Thus, contemplated patterns include straight and curved lines, intersections of lines, lines with widened or narrowed areas, ribbons, overlapping lines. Contemplated thin layers and ultra thin layers may range from less than about 1 μm down to about one Angstrom or even down to the size of a single atomic layer of material. Specifically, some contemplated thin layers are less than about 1 μm thick. In other embodiments, contemplated thin layers are less than about 500 nm thick. In some embodiments, contemplated ultra thin layers are less than about 100 nm thick. In yet other embodiments, contemplated ultra thin layers are less than about 10 nm thick.

These layers are generally laid down by any method capable of producing a uniform layer with a minimum of pores or voids and can further lay down the layer with a relatively high deposition rate. Many suitable methods and apparatus are available to lay down layers or ultra thin layers of this type, however, one of the best apparatus and methods of achieving a high quality layer of material is pulsed plating. Pulsed plating (which is intermittent plating as opposed to direct current plating) can lay down layers that are free or virtually free of pores and/or voids. It has been discovered that the lack of pores helps to control migration of the constituents of the other layers past the plated layer. For example, when a gold layer is pulse plated onto a nickel-based heat spreader, the relatively nonporous gold layer effectively controls migration of nickel atoms across the gold layer and into adjacent layers. On the contrary, direct current plating, which is suitable for many applications, including decorative jewelry, connections and other applications where thicker (greater than about 1 μm), cannot provide the essentially pore free layers that are required for the applications described herein.

Another method of laying down thin layers or ultra thin layers is the pulse periodic reverse method or "PPR". The pulse periodic reverse method goes one step beyond the pulse plating method by actually "reversing" or depleting the film at the cathode surface. A typical cycle for pulse periodic reverse might be 10 ms at 5 amps cathodic followed by 0.5 ms at 10 amps anodic followed by a 2 ms off time. There are several advantages of PPR. First, by "stripping" or deplating a small amount of film during each cycle, PPR forces new nucleation sites for each successive cycle resulting in further reductions in porosity. Second, cycles can be tailored to provide very uniform films by selectively stripping the thick film areas during the "depleting" or anodic portion of the cycle. PPR does not work well for some metal deposition, such as gold deposition, because cold plating is normally done in systems with no free cyanide. Hence gold will plate from a cyanide complex (chelate) during the plate cycle but cannot "strip" during the deplate cycle as there is no cyanide to allow the gold to re-dissolve. Pulse plating and pulse periodic reverse systems can be purchased from any suitable source, such as a company like Dynatronix™ or built (in whole or in part) on site.

As used herein, the term 'metal' means those elements that are in the d-block and f-block of the Periodic Chart of the Elements, along with those elements that have metal-like properties, such as silicon and germanium. The term "metal" includes the group of metals commonly referred to as transition metals. As used herein, the phrase "d-block" means those elements that have electrons filling the 3d, 4d, 5d, and 6d orbitals surrounding the nucleus of the element. As used herein, the phrase "f-block" means those elements that have electrons filling the 4f and 5f orbitals surrounding the nucleus of the element, including the lanthanides and the actinides. Preferred metals include indium, lead, gold, silver, copper, tin, bismuth, gallium and alloys thereof, silver coated copper, and silver coated aluminum. The term "metal" also includes alloys, metal/metal composites, metal ceramic composites, metal polymer composites, as well as other metal composites.

As mentioned earlier, one of the contemplated embodiments comprises forming a coating of solder itself using a pulse-plated method and/or apparatus. As an example, a contemplated layered material might comprise: a) a thermal conductor, such as copper; b) a protective layer, such as nickel, to protect the thermal conductor; c) a layer of material to accept the solder and prevent the formation of oxides, such as nickel oxide; and d) a layer of solder to attach to the electronic component, such as a die. The layer of material to accept the solder and the layer of solder can be combined by plating the solder directly on the electronic component and/or heat spreader after suitable preparation steps to remove any nickel oxide layers. In addition, the layer of material to accept the solder can be electroplated and the solder layer can be silk-screened, attached as a preform, etc. All of the layers previously mentioned would benefit from pulse-plating or pulse periodic reverse plating, as this approach serves to tighten the grain structure and eliminate porosity without any real disadvantages.

Once the thermal interconnect layer is deposited it is understood that it will have a relatively high thermal conductivity as compared to conventional thermal adhesives and other thermal layers. Additional layers, such as a metallized silicon die can be soldered directly to the thermal interconnect layer without the use of such damaging materials as corrosive fluxes that may be needed to remove oxides of the materials, such as nickel, used to produce the thermal spreader.

Heat spreader components or heat spreading components (heat spreader and heat spreading are used herein interchangeably and have the same common meaning) generally comprise a metal or metal-based base material, such as nickel, aluminum, copper, or AlSiC. Any suitable metal or metal-based base material can be used herein as a heat spreader, as St long as the metal or metal-based base material can dissipate some or all of the heat generated by the electronic component.

Heat spreader components can be laid down in any suitable thickness, depending on the needs of the electronic component, the vendor and as long as the heat spreader component is able to sufficiently perform, the task of dissipating some or all of the heat generated from the surrounding electronic component. Contemplated thicknesses comprise thicknesses in the range of about 0.25 mm to about 6 mm. Especially preferred thicknesses of heat spreader components are within the range of about 1 mm to about 5 mm.

The layered interface material and/or interconnect material may then be applied to a substrate, another surface, or another layered material. Substrates contemplated herein may comprise any desirable substantially solid material. Particularly desirable substrate layers would comprise films, glass, ceramic, plastic, metal or coated metal, or composite material. In preferred embodiments, the substrate comprises a silicon or germanium arsenide die or wafer surface, a packaging surface such as found in a copper, silver, nickel or gold plated leadframe, a copper surface such as found in a circuit board or package interconnect trace, a via-wall or stiffener interface ("copper" includes considerations of bare copper and it's oxides), a polymer-based packaging or board interface such as found in a polyimide-based flex package, lead or other metal alloy solder ball surface, glass and polymers such as polyimide. The "substrate" may even be defined as another polymer material when considering cohesive interfaces. In more preferred embodiments, the substrate comprises a material common in the packaging and circuit board industries such as silicon, copper, glass, and another polymer.

Additional layers of material may be coupled to the layered interface materials in order to continue building a layered component. It is contemplated that the additional layers will comprise materials similar to those already described herein, including metals, metal alloys, composite materials, polymers, monomers, organic compounds, inorganic compounds, organometallic compounds, resins, adhesives and optical wave-guide materials.

A layer of laminating material or cladding material can be coupled to the layered interface materials depending on the specifications required by the component. Laminates are generally considered fiber-reinforced resin dielectric materials. Cladding materials are a subset of laminates that are produced when metals and other materials, such as copper, are incorporated into the laminates. (Harper, Charles A., *Electronic Packaging and Interconnection Handbook*, Second Edition, McGraw-Hill (New York), 1997.)

Spin-on layers and materials may also be added to the layered interface materials or subsequent layers. Spin-on stacked films are taught by Michael E. Thomas, "Spin-On Stacked Films for Low $k_{eff}$ Dielectrics", *Solid State Technology* (July 2001), incorporated herein in its entirety by reference.

Applications of the contemplated thermal solutions, IC Packages, thermal interface components, layered interface materials and heat spreader components described herein comprise incorporating the materials and/or components into another layered material, an electronic component or a finished electronic product. Electronic components, as contemplated herein, are generally thought to comprise any layered component that can be utilized in an electronic-based product. Contemplated electronic components comprise circuit boards, chip packaging, separator sheets, dielectric components of circuit boards, printed-wiring boards, and other components of circuit boards, such as capacitors, inductors, and resistors.

Electronic-based products can be "finished" in the sense that they are ready to be used in industry or by other consumers. Examples of finished consumer products are a television, a computer, a cell phone, a pager, a palm-type organizer, a portable radio, a car stereo, and a remote control. Also contemplated are "intermediate" products such as circuit boards, chip packaging, and keyboards that are potentially utilized in finished products.

Electronic products may also comprise a prototype component, at any stage of development from conceptual model to final scale-up/mock-up. A prototype may or may not contain all of the actual components intended in a finished product, and a prototype may have some components that are constructed out of composite material in order to negate their initial effects on other components while being initially tested.

EXAMPLES

Heat spreaders were produced and plated with a gold spot using available masking technologies. Initial samples produced using DC current and a deposition rate of 0.25 microns/10 seconds left a red deposit. This red color can be an indication of porosity, as it suggests a deposition rate exceeding the electrolytes ability to replenish gold at the work surface. Dropping the deposition rate to 0.25 microns/20 seconds helped to return gold to a more pleasing lemon yellow color. However, this deposition rate was unacceptable for contemplated uses.

A pulse plating system with a pulse cycle of 1.0 millisecond on and 9.0 milliseconds off (10% duty) was produced.

Using this cycle, it was possible to deposit 0.25 microns of lemon yellow gold in about 8 seconds.

Using a more aggressive pulse cycle of 0.1 millisecond on and 3.0 milliseconds off (3.3% duty), cycle times of 5 seconds were achieved, while maintaining a lemon yellow color.

Another contemplated pulse cycle was tested wherein the pulse plating duty cycle was 0.3 milliseconds on and 0.3 milliseconds off with 2.1 amps average current for about 15 seconds. This cycle is adequate to deposit 0.14 microns of gold evenly across 32 work pieces.

Thus, specific embodiments and applications of thermal solutions, IC packaging, thermal interconnect and interface materials have been disclosed. It should be apparent, however, to those skilled in the art that many more modifications besides those already described are possible without departing from the inventive concepts herein. The inventive subject mater, therefore, is not to be restricted except in the spirit of the disclosure. Moreover, in interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

We claim:

1. A method of forming a heat spreader, comprising:
   electroplating gold to a heat spreader component for between about 0.1 milliseconds and about 1 millisecond;
   pausing for between about 0.3 milliseconds and about 9 milliseconds; and
   repeating the electroplating and pausing cycle until a substantially non-porous layer of gold is formed on the heat spreader component.

2. The method of claim 1, further comprising coupling an additional layer to the gold layer.

3. The method of claim 1, wherein the heat spreader component comprises silicon, carbon or a combination thereof.

4. The method of claim 1, wherein plating the gold comprises pulsing at an average of about 2.1 amps.

5. The method of claim 1, comprising a cycle of electroplating for about 1 millisecond and pausing for about 9 milliseconds.

6. The method of claim 5, wherein the cycle lasts about 8 seconds.

7. The method of claim 1, comprising a cycle of electroplating for about 0.5 milliseconds per 10 amps anodic and pausing for about 2 milliseconds.

8. The method of claim 1 comprising a cycle of electroplating for about 0.1 millisecond and pausing for about 3 milliseconds.

9. The method of claim 8, wherein the cycle lasts about 5 seconds.

10. The method of claim 1, comprising a cycle of electroplating at an average of about 2.1 amps for about 0.3 millisecond and pausing for about 0.3 milliseconds.

11. The method of claim 10, wherein the cycle lasts about 15 seconds.

12. The method of claim 1, wherein the layer of metal-based thermally conductive material is less than about 500 nm thick.

13. The method of claim 1, wherein the layer of metal-based thermally conductive material is less than about 100 nm thick.

14. A method of forming a layered heat spreader, comprising:
    electroplating a substantially non-porous thermally conductive layer of gold onto a heat spreader component by applying an intermittent electrical pulse until the thermally conductive layer has a thickness of between about 0.1 µm and about 1 µm.

15. The method of claim 14, wherein the thermally conductive layer has a thickness of between about 0.5 µm and about 1 µm.

* * * * *